(12) United States Patent
Ishii

(10) Patent No.: US 11,418,180 B2
(45) Date of Patent: Aug. 16, 2022

(54) EQUALIZER AND COMMUNICATION MODULE USING THE SAME

(71) Applicant: Fujitsu Optical Components Limited, Kawasaki (JP)

(72) Inventor: Toshio Ishii, Yokohama (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 0 days.

(21) Appl. No.: 17/166,844

(22) Filed: Feb. 3, 2021

(65) Prior Publication Data
US 2021/0305976 A1    Sep. 30, 2021

(30) Foreign Application Priority Data
Mar. 24, 2020  (JP) ................. JP2020-052640

(51) Int. Cl.
| | |
|---|---|
| *H03K 5/14* | (2014.01) |
| *H04L 27/36* | (2006.01) |
| *H04L 25/03* | (2006.01) |
| *H03G 5/16* | (2006.01) |

(52) U.S. Cl.
CPC .............. *H03K 5/14* (2013.01); *H03G 5/165* (2013.01); *H04L 25/03878* (2013.01); *H04L 27/36* (2013.01)

(58) Field of Classification Search
CPC .......... H03G 5/165; H03H 7/30; H03H 11/26; H03H 17/04; H03H 17/06; H03K 5/14; H03K 5/159; H03M 1/12; H03M 1/74; H03M 3/00; H04B 1/04; H04B 10/06; H04B 10/08; H04B 10/75; H04L 12/26; H04L 25/03; H04L 25/06; H04L 25/03878; H04L 27/01; H04L 27/36
USPC ........ 341/141, 143, 155; 375/229, 232, 233, 375/346, 349; 398/25, 202, 208
See application file for complete search history.

(56) References Cited

U.S. PATENT DOCUMENTS

| | | | |
|---|---|---|---|
| 7,330,506 B2 | 2/2008 | Gorecki et al. | |
| 2003/0035474 A1* | 2/2003 | Gorecki | ............ H04L 25/03987 375/229 |
| 2010/0209121 A1* | 8/2010 | Tanimura | ............ H04B 10/6162 398/202 |
| 2016/0241422 A1* | 8/2016 | Akita | ...................... H04L 25/03 |
| 2019/0339584 A1* | 11/2019 | Kojima | .................. H03H 17/04 |

FOREIGN PATENT DOCUMENTS

JP    2008-219078 A    9/2008

* cited by examiner

*Primary Examiner* — Shawkat M Ali
(74) *Attorney, Agent, or Firm* — Staas & Halsey LLP

(57) ABSTRACT

An equalizer has a first tapped delay line in which N taps (N is a positive integer) are connected in cascade, a second tapped delay line having one tap and connected in parallel with the first tapped delay line, a first multiplier configured to multiply signals extracted from the N taps by corresponding coefficients, a second multiplier configured to multiply a signal output from the second tapped delay line by a second coefficient, and an adder configured to add products of the first multiplier and a product of the second multiplier. The first tapped delay line has a fixed delay, and the second tapped delay line has a variable delay changeable at a 1/M resolution of the fixed delay, where M is a number greater than 1.

7 Claims, 10 Drawing Sheets

(A) EXAMPLE OF FREQUENCY TRANSFER FUNCTION AT REFLECTING ZONE $$G(\omega) = 1 + L_i \cdot L_O \cdot \cos\omega D + j(-L_i \cdot L_O \cdot \sin\omega D)$$

(B) EXAMPLE OF FREQUENCY TRANSFER FUNCTION OF FIR FILTER $$F(\omega) = \sum_{k=-n}^{n} C_k \cdot e^{-j\omega k\tau} = \sum_{k=-n}^{n} \{C_k \cdot \cos\omega k\tau + j(-C_k \cdot \sin\omega k\tau)\}$$

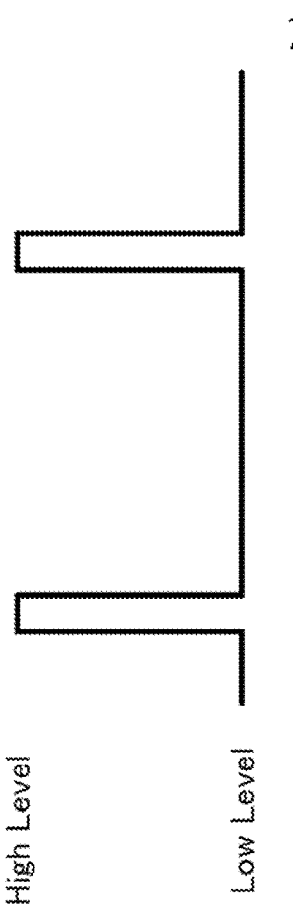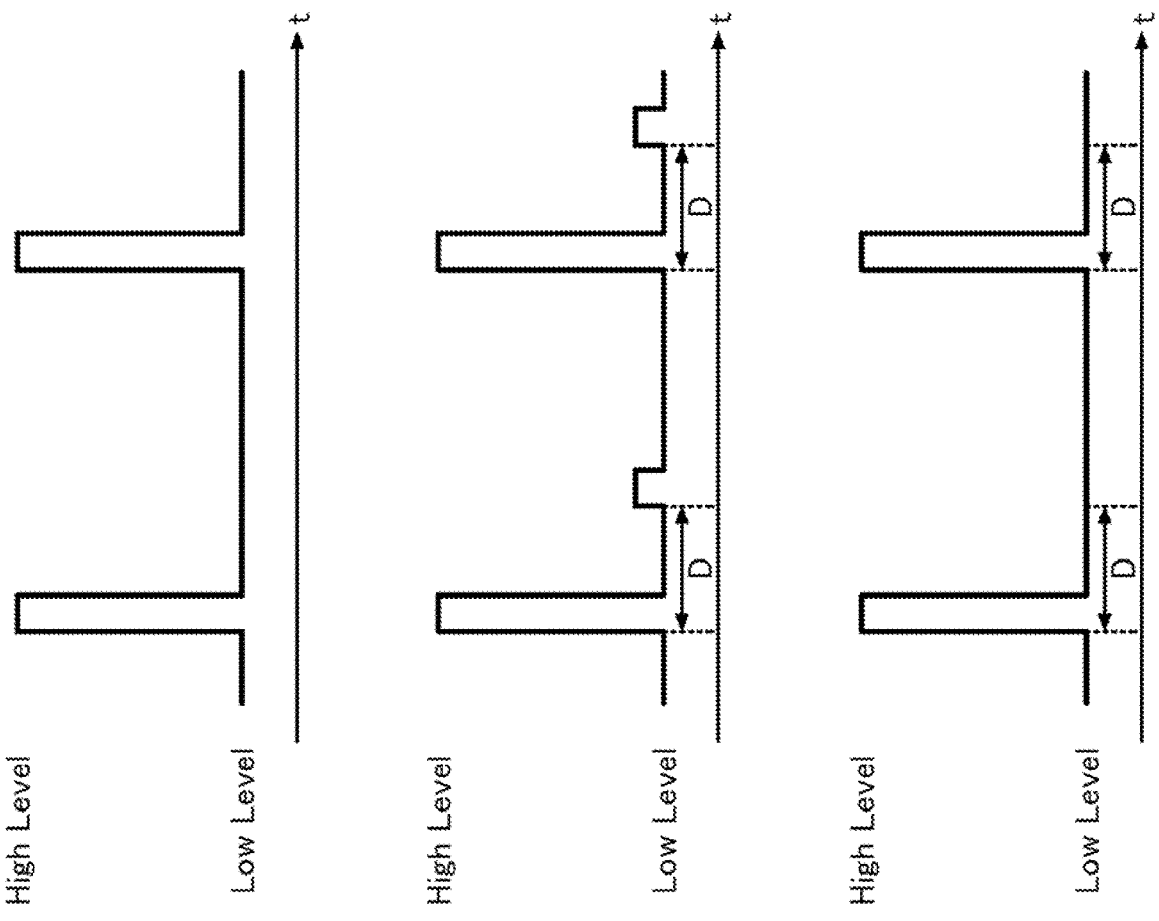

- - - - target frequency characteristic to be achieved
——— frequency characteristic achieved by embodiment

- - - - target frequency characteristic to be achieved
——— frequency characteristic obtained by conventional FIR filter

EQUALIZER AND COMMUNICATION MODULE USING THE SAME

CROSS-REFERENCE TO RELATED APPLICATIONS

This application is based upon and claims priority to earlier Japanese Patent Application No. 2020-052640 filed Mar. 24, 2020, which is incorporated herein by reference in its entirety.

FIELD

The present disclosure relates to an equalizer and a communication module using the same.

BACKGROUND

With the increase in data transmission capacity, data transfer rate is getting higher, and the degree of multilevel signaling is increasing. 400G-standardized data center communication modules adopt 4-level pulse amplitude modulation (PAM-4) signaling.

At a high data transfer rate, the signal bandwidth is likely to be limited by high-frequency parts or assemblies. In order to compensate for the limited bandwidth, digital filters such as finite impulse response (FIR) filters are typically used. See, for example, Patent Document 1 presented below. Further, a variable delay FIR equalizer for a transmitter module has been proposed. See, for example, Patent Document 2.

RELATED PUBLICATIONS

Patent Document 1: Japanese Patent Application Laid-open Publication No. 2008-219078
Patent Document 2: U.S. Pat. No. 7,330,506

SUMMARY

According to one aspect of the disclosure, an equalizer includes
a first tapped delay line in which N taps are connected in cascade, where N is a positive integer,
a second tapped delay line connected in parallel with the first tapped delay line, the second tapped delay line having one tap,
a first multiplier configured to multiply signals extracted from the N taps by corresponding coefficients,
a second multiplier configured to multiply a signal output from the second tapped delay line by a second coefficient, and
an adder configured to add products of the first multiplier and a product of the second multiplier,
wherein the first tapped delay line has a fixed delay, and the second tapped delay line has a variable delay changeable at a 1/M resolution of the fixed delay, where M is a number greater than 1.

The object and advantages of the invention will be realized and attained by means of the elements and combinations particularly pointed out in the claims. It is to be understood that both the foregoing general description and the following detailed description are exemplary and explanatory and are not restrictive to the invention as claimed.

BRIEF DESCRIPTION OF DRAWINGS

FIG. 7A illustrates a signal waveform without reflection;

FIG. 7B illustrates a signal waveform when reflection has occurred without reflection canceller;

FIG. 7C illustrates a signal waveform when reflection has occurred in the configuration of an embodiment;

DESCRIPTION OF EMBODIMENTS

Due to higher-level signaling, eye amplitudes between adjacent voltage levels in an eye diagram are getting smaller. The influence of deterioration of the eye pattern due to reflected waves is not negligible any longer. Because a typical FIR filter has a fixed delay, it is difficult for the ordinary FIR filter to cancel or compensate for the influence of reflection which varies depending on the length of transmission lines between connected parts or assemblies. The adverse influence of reflected waves may be reduced by providing a large number of taps, but the circuit scale and power consumption inevitably increase. As for a variable delay FIR equalizer, a shaping resolution is coarser (or larger) than a fixed-delay FIR filter. The conventional variable delay FIR equalizer is not able to satisfactorily reduce the influence of reflection.

It is desired to satisfactorily reduce or compensate for the influence of reflected waves in communication modules, while minimizing the increase in the circuit scale and power consumption.

Figure 1:
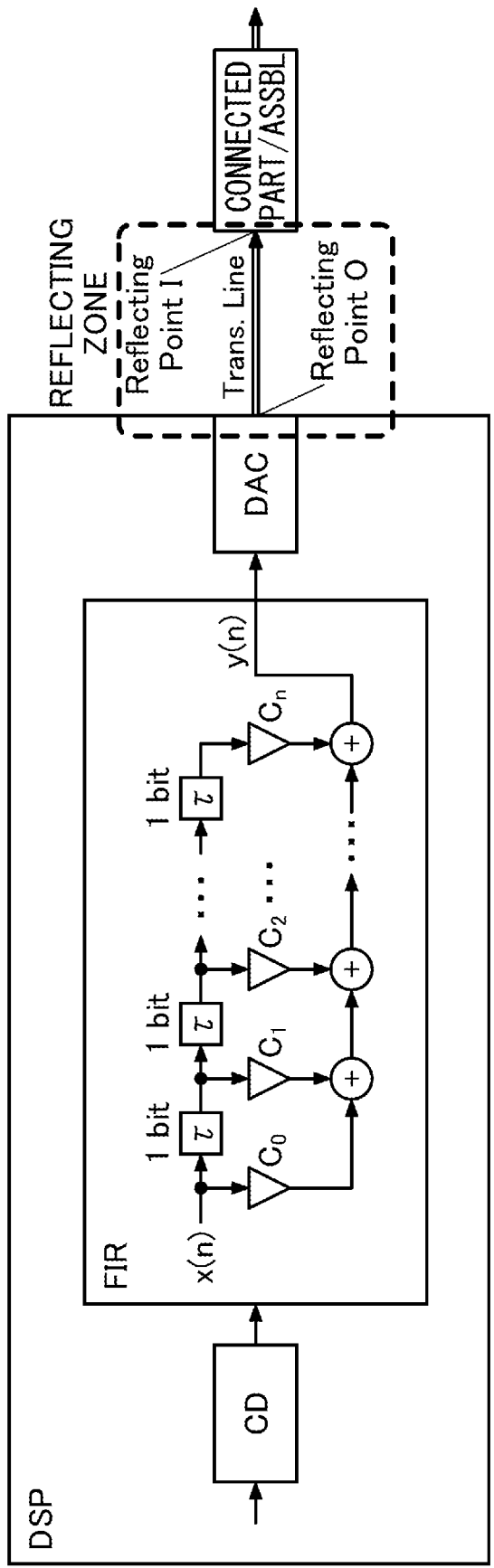
FIG. 1 illustrates a technical problem in a conventional FIR filter.

FIG. 1 illustrates a technical problem found by the inventor, that is, compensation for reflection is needed when waveforms are shaped using a general FIR filter. In optical transmission and reception at a high-speed optical communication transceiver module, waveform distortion due to insufficient bandwidth of parts or components is generally compensated for by digital signal processing. Multi-level signaling such as PAM-4 is adopted for high-speed, high-capacity optical communication. To maintain the signal quality, waveform shaping is performed to maintain satisfactory eye openings at both the transmitter and the receiver.

An FIR filter is typically used as a digital filter for bandwidth compensation. The FIR filter modifies the shape of a waveform by shifting the encoded input digital signal at a predetermined delay along the time axis, and by weighting it with coefficients $C_0$ to $C_n$ and summing up the terms or products up.

The waveform-shaped signal is then converted into an analog electrical signal by a digital-to-analog converter (DAC) and supplied to a connected part/assembly of the next block.

The DSP and the connected part/assembly are connected through an electric transmission line. The analog electrical signal output from the DSP is reflected from the input point (reflecting point I) of the connected part/assembly, and a part of the signal component returns back to the DSP. The signal having returned to the DSP is reflected again from the output point (reflecting point O) of the DSP and travels to the connected part/assembly. This type of reflection causes a loss in the transmitted signal.

Assuming that the length of the transmission line is D/2 (where D is a delay time at an operating frequency), then the length of the round-trip transmission line, namely, the transmission delay time is D. The frequency transfer function $G(\omega)$ of the reflecting zone may be expressed, for example, by the following equation.

$$G(\omega) = 1 + L_i \cdot L_O \cdot \cos \omega D + j(-L_i \cdot L_O \cdot \sin \omega D)$$

where "$L_i$" is attenuation at the reflecting point I, and "$L_o$" is attenuation at the reflecting point O. For the sake of simplification, it is assumed that the group delay on the electric transmission line, the S11 reflection characteristic, and the S22 reflection characteristic are constant with respect to the frequency.

The first term on the right-hand side of the equation represents the signal output from the DSP which is normalized to 1. The round-trip transmission delay time D included in the real part and the imaginary part of the reflected signal component is not always an integer.

Meanwhile, the frequency transfer function $F(\omega)$ of the FIR filter is expressed by, for example, the following equation.

$$F(\omega) = \sum_{k=-n}^{n} C_k \cdot e^{-j\omega k\tau} = \sum_{k=-n}^{n} \{C_k \cdot \cos\omega k\tau + j(-C_k \cdot \sin\omega k\tau)\}$$

where k is a tap number, Ck is a weighting factor or a coefficient for each tap, and T is a fixed delay. The sum of the products at the (2n+1) taps ranging from −n to +n, centered at k=0, are output from the FIR filter.

The variable k in the real part and the imaginary part of the signal equalized by the FIR filter is an integer. Since a typical FIR filter has a fixed delay, it is difficult for it to compensate for the reflected wave depending on the reflection delay time or the effective length of the transmission line, which is not necessarily an integer multiple of the fixed delay. By providing a large number of taps in the FIR filter, the influence of reflection may be reduced; however, the circuit scale and the power consumption will increase.

When a PAM-4 modulation scheme is employed, bit strings represented by "0" and "1" are transmitted as pulse signals at four voltage levels, "00", "01", "10," and "11", where the transmission capacity per unit time is doubled. It is preferable for PAM-4 signaling that the return loss be compensated for as accurately as possible in order to maintain the three eye openings between the adjacent voltage levels in the satisfactory shapes.

In the following embodiments, a digital filter having a variable delay is provided to compensate for reflection at a high resolution depending on the amount of delay due to the reflection.

Figure 2:
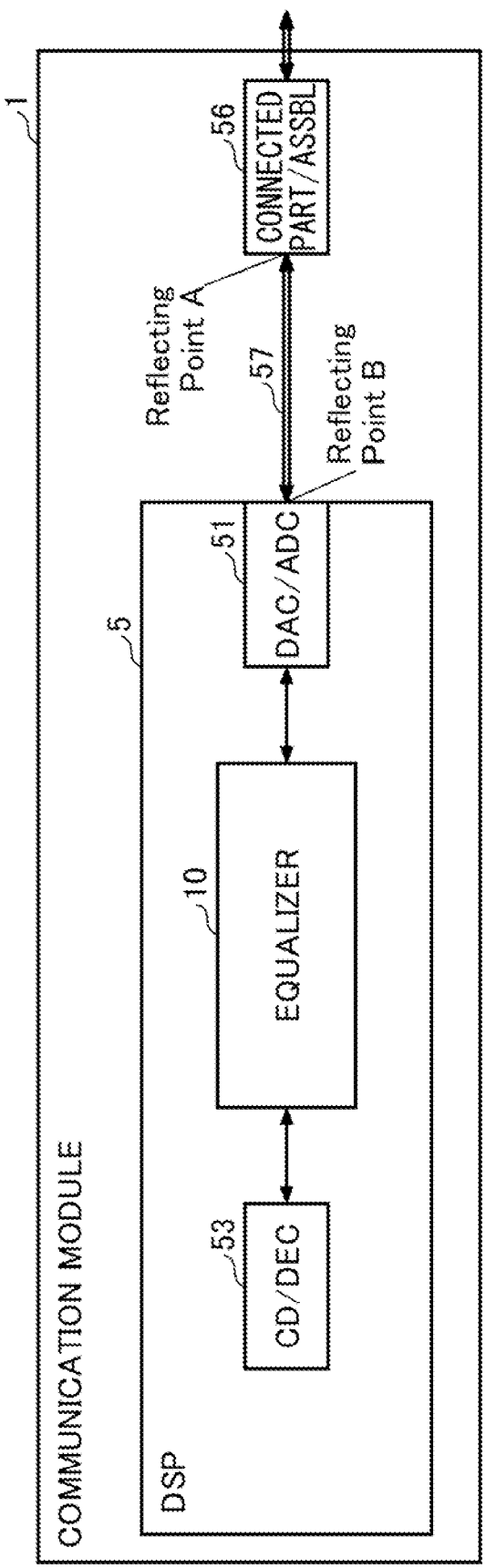
FIG. 2 is a schematic diagram of a communication module using an equalizer of an embodiment.

FIG. 2 is a schematic diagram of a communication module 1 using an equalizer of an embodiment. The communication module 1 has a DSP 5 and a connected part/assembly 56. The DSP 5 and the connected part/assembly 56 are connected through an electric transmission line 57.

The DSP 5 has, for example, a digital-to-analog and analog-to-digital converter (labelled as "DAC/ADC" in the figure) 51, an equalizer 10, and a coder and decoder circuit (labelled as "CD/DEC" in the figure) 53.

An electric signal is reflected from the connection point (labelled as "Reflecting Point A" in the figure) between the transmission line 57 and the connected part/assembly 56. The electric signal is again reflected from another connection point (labelled as "Reflecting Point B" in the figure) between the transmission line 57 and the DSP 5. The delayed signal component reflected from the reflecting points is mixed into the pulse signal behind the pulse output timing from the DSP 5 or the pulse input timing into the DSP 5, with a certain time delay.

The equalizer 10 is configured to shape the signal waveform. Waveform shaping includes equalization of waveform distortion caused by wavelength dispersion or polarization mode rotation occurring on the optical transmission lines, shaping for bandwidth compensation for band-limited signals, compensation for reflected waves generated at reflecting points, etc.

As will be described later, the equalizer 10 has a variable delay at a desired resolution, and compensates for reflection based upon the amount of delay in accordance with the effective path length of the transmission line 57. At the transmitter side, a signal with a reflection-compensated waveform equalized in advance by the equalizer 10 is output to the transmission line 57. At the receiver side, a signal with a waveform from which influence of reflection has been removed by the equalizer 10 is supplied to the subsequent decoder block.

Configuration Example 1 of Equalizer

Figure 3:
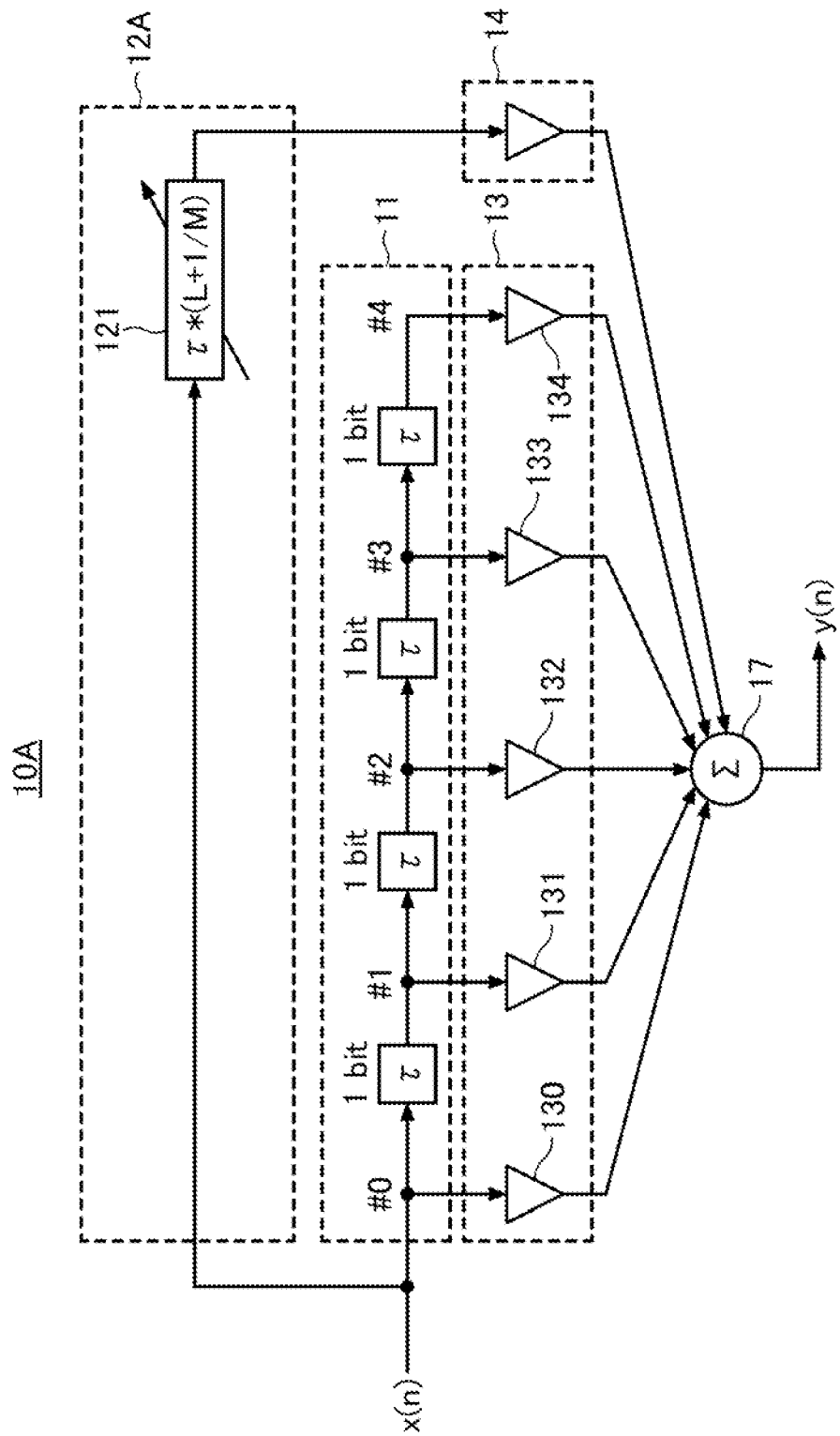
FIG. 3 illustrates a configuration example of an equalizer according to an embodiment.

FIG. 3 illustrates an example of the equalizer 10A according to an embodiment. The equalizer 10A has a first tapped delay line 11 and a second tapped delay line 12A. The first tapped delay line 11 has a fixed delay. The second tapped delay line 12A has a variable delay. The equalizer 10A also has a first multiplier 13 that multiplies the outputs of the first tapped delay line 11 by coefficients, a second multiplier 14 that multiplies the output of the second tapped delay line 12A by a coefficient, and an adder 17 that sums up the outputs of the first multiplier 13 and the output of the second multiplier 14.

The first tapped delay line 11 has N taps (where N is an integer greater than or equal to 2) connected in cascade with respect to the input signal x(n). In this example, five taps #0 to #4 are connected in cascade. A tap is a branch node connected to an input of the multiplier 13. In the first tapped delay line 11, a delay $\tau$ is inserted between adjacent taps. The delay $\tau$ is a fixed delay. In this example, the fixed delay is one bit.

The second tapped delay line 12A is connected in parallel with the first tapped delay line 11. The second tapped delay line 12A has one tap and a variable delay 121.

The variable delay 121 has a delay $\tau \times (L+1/M)$, where M is a number greater than 1 (M>1) and L is an integer greater than or equal to 0. The variable delay 121 can be set to an appropriate value depending on the effective transmission path length of the reflecting zone. The variable delay 121 changes the fixed delay τ of the first tapped delay line 11 at a resolution of 1/M (M>1).

For example, when the round-trip transmission delay time D of the reflecting zone is a 3.5 unit interval (UI), then L=3 and M=2 can be chosen to generate a delay to compensate for this reflection delay. In another example, when L=0 and M=10 are chosen, a delay of τ/10 can be generated. By determining the values for L and M, not only a delay at any one of the taps #0 to #4, but also a delay smaller than τ or greater than 4×τ at the tap #4 can be produced. The resolution of delay creation is 1/M of the fixed delay τ, and the accuracy of compensation for reflection is improved to a desired level depending on the value of M.

The values of L and M may be determined when the communication module 1 is designed, in accordance with the effective length (or the round-trip transmission delay time D at an operating frequency) of the transmission line 57 in a site where reflection occurs on the circuit chip. The values of L and M determined at the designing stage may be fine-tuned during pre-shipment inspection.

The first multiplier 13 includes multipliers 130, 131, 132, 133 and 134, respectively connected to the taps #0 to #4. The respective multipliers 130 to 134 multiply the outputs from the associated taps #0 to #4 by coefficients C0 to C4. The coefficients C0 to C4 for the taps #0 to #4 are determined by the transmission characteristics of the communication module 1. The frequency transfer function of the k-th multiplier is expressed as $$C_k^* \cos(\omega k\tau) - jC_k^* \sin(\omega k\tau),$$

where k is an integer. The waveform of the input signal x(n), other than the reflected component of the wave, is equalized by the first tapped delay line 11 and the first multiplier 13.

The second multiplier 14 is connected to the tap of the second tapped delay line 12A. The coefficient $C_{var}$ multiplied at the second multiplier 14 is determined according to the amount of delay due to reflection occurring. The second tapped delay line 12A and the second multiplier 14 compensate for a reflection delay that is not an integer multiple of the fixed delay τ, at a resolution of 1/M (M>1).

The adder 17 sums up the outputs of the multipliers 130 to 134 and the output of the second multiplier 14, and outputs a signal y(n). The equalizer 10A may be called a feedforward equalizer because there is no feedback path returning from the output port back to the input port and because the signal is fed forward in one direction.

The equalizer 10A can compensate for not only an integer multiple delay of the fixed delay τ, but also a delay component, such as a reflection delay occurring in a circuit, smaller than the fixed delay τ. Because the second tapped delay line 12A having one tap is connected in parallel with the first tapped delay line 11, and because the second multiplier 14 is simply added, the expansion of the circuit is minimal and the increase in the power consumption is insignificant.

Configuration Example 2 of Equalizer

Figure 4:
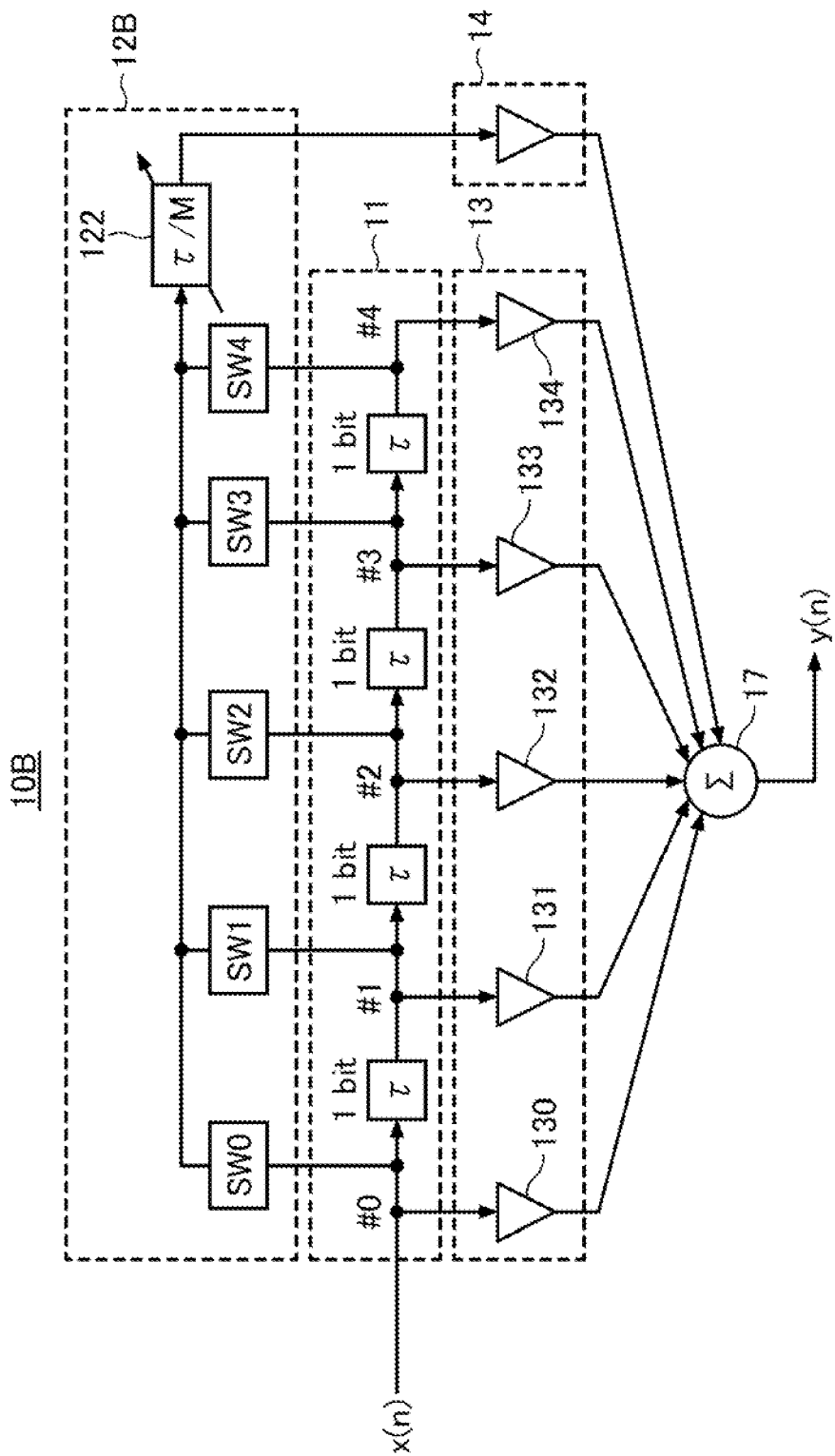
FIG. 4 illustrates another configuration example of the equalizer of the embodiment.

FIG. 4 illustrates an example of an equalizer 10B according to another embodiment. The equalizer 10B may be suitably used when the amount of transmission delay at a reflecting point is small.

The equalizer 10B has a first tapped delay line 11 and a second tapped delay line 12B. The first tapped delay line 11 has a fixed delay. The second tapped delay line 12B has a variable delay. The configurations of the first multiplier 13 connected to the first tapped delay line 11, the second multiplier 14 connected to the second tapped delay line 12B, and the adder 17 are the same as those of the equalizer 10A illustrated in of FIG. 3.

The first tapped delay line 11 has N taps (where N is a positive integer) connected in cascade with respect to the input signal x(n), and a delay τ is inserted between any two adjacent taps. In this example, five taps #0 to #4 are connected in cascade and four delays τ are inserted between the adjacent taps. The delay τ is a fixed delay.

The second tapped delay line 12B has one tap connected to the second multiplier 14 and a variable delay 122. The second tapped delay line 12B also has switches SW0 to SW4 connected to the delay segments of the taps #0 to #4 of the first tapped delay line 11. The variable delay 122 generates a delay equal to 1/M (M is a number greater than 1) of the delay determined by the position of the switch SW.

In the configuration example 1 of FIG. 3, a delay component corresponding to an integer multiple of the fixed delay τ is generated by selecting the value of "L" for the variable delay 121. In the configuration example of FIG. 4, by selecting and turning on any of the switches SW0 to SW4, a desired amount of delay can be generated within the range between a delay at the selected switch position and a delay at the next switch position.

For example, when SW1 is turned on, while the other switches SW0, SW2, SW3 and SW4 are turned off, a desired amount of delay can be generated in the range from 1.000 . . . bits to 1.999 . . . bits. Delay "T" described in the block of the variable delay 122 has a value determined by the switch to be selected. In the 5-tap configuration of FIG. 4, the delay generated by the variable delay 122 ranges from τ/M to less than 5τ/M.

The ON-switch and the value of M for the variable delay 122 may be designated in the design phase of the communication module 1, based upon the effective length of the transmission line (or the round-trip transmission delay time D at an operating frequency) of the reflecting site of the circuit chip. The ON-switch and the value M designated in the design phase may be changed later, for example, during pre-shipment inspection.

The maximum delay generated by the variable delay 122 of the equalizer 10B is the sum of the cumulative delay of N taps and τ/M, that is, (N−1)*τ+(τ/M). Although the maximum delay of the variable delay 122 is limited by the number of taps, a delay below the decimal point can be generated at a high resolution in the same manner as the equalizer 10A. Therefore, the equalizer 10B is efficiently applicable when the round-trip transmission delay time D at the reflecting site is small.

<Applications to Optical Transmitter and Receiver>

Figure 5:
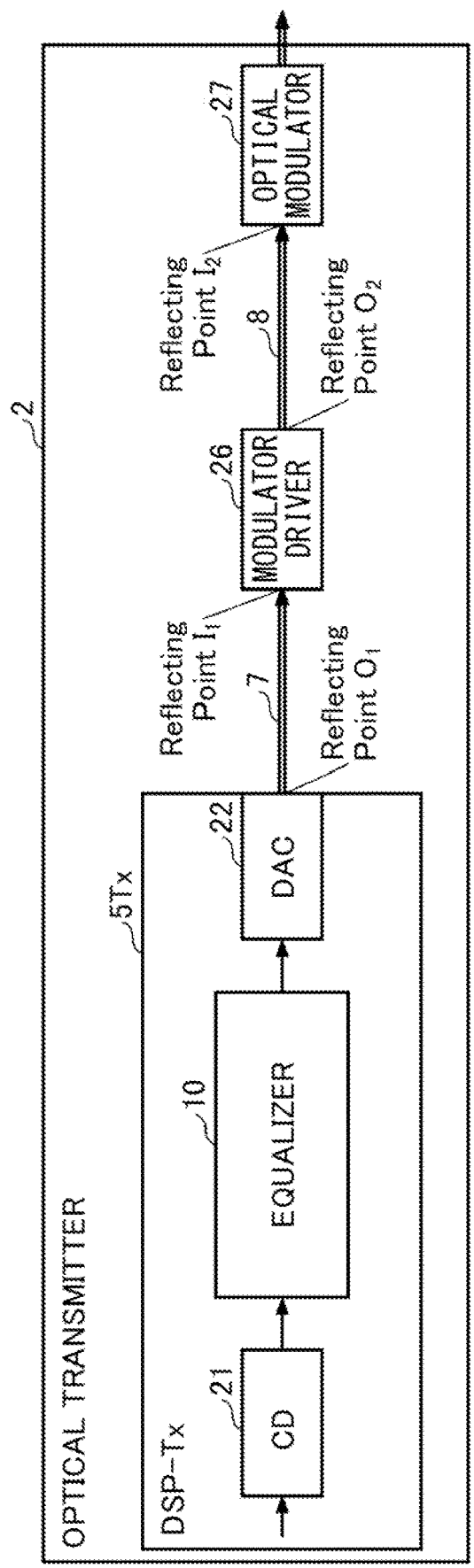
FIG. 5 is a schematic diagram of an optical transmitter using an equalizer of the embodiment.

FIG. 5 is a schematic diagram of an optical transmitter 2 using an equalizer 10 of an embodiment. The optical transmitter 2 is an example of the communication module 1. The optical transmitter 2 has a DSP 5Tx, a modulator driver 26, and an optical modulator 27. The modulator driver 26 and the light modulator 27 are examples of the connected part/assembly 56 illustrated in FIG. 2. The DSP 5Tx and the modulator driver 26 are connected by an electric transmission line 7. The modulator driver 26 and the optical modulator 27 are connected by an electric transmission line 8.

The DSP 5Tx has a DAC 22, an equalizer 10, and a coder circuit (labelled as "CD" in the figure) 21. A signal from a client device is input to the DSP 5Tx. In the DSP 5Tx, the input signal is encoded into an optical transmission signal format and output to the equalizer 10.

The equalizer 10 shapes the waveform of the encoded signal, and compensates in advance for reflection that is generated on the transmission line 7 or 8. The waveform-shaped signal is converted into an analog electric signal by the DAC 22 and output to the transmission line 7.

On the transmission line 7, the reflecting point $O_1$ may reside at the output end of the DSP 5Tx, and the reflecting point $I_1$ may reside at the input end to the modulator driver 26. On the transmission line 8, the reflecting point $O_2$ may reside at the output end of the modulator driver 26, and the reflecting point $I_2$ may reside at the input end to the optical modulator 27.

When the transmission delay times D of the transmission line 7 and the transmission line 8 are the same, the equalizer 10 can simultaneously compensate for the reflection of the two transmission lines 7 and 8. Even when the transmission delay time of the transmission line 7 and the transmission line 8 is not an integer multiple of the fixed delay $\tau$ of the equalizer 10, the variable delay 121 or 122 of the second tapped delay line 12A or 12B can produce a fraction of $\tau$ at a resolution of 1/M.

When the lengths or the transmission delay times of the transmission line 7 and the transmission line 8 are different from each other, then the reflected wave on either one of the transmission lines with greater reflection may be compensated for. The analog electric signal output from the DSP 5Tx is converted by the modulator driver 26 into a high-frequency pulse signal of a predetermined voltage level and input to the optical modulator 27. The optical modulator 27 may be of an integrated type in which a laser diode is built in as a light source. The light modulator 27 modulates the light beam emitted from the light source with high-frequency pulse signals, and outputs modulated light signals. The optical loss due to reflected waves is compensated for at fine accuracy, while minimizing increase in the circuit scale and energy consumption.

Figure 6:
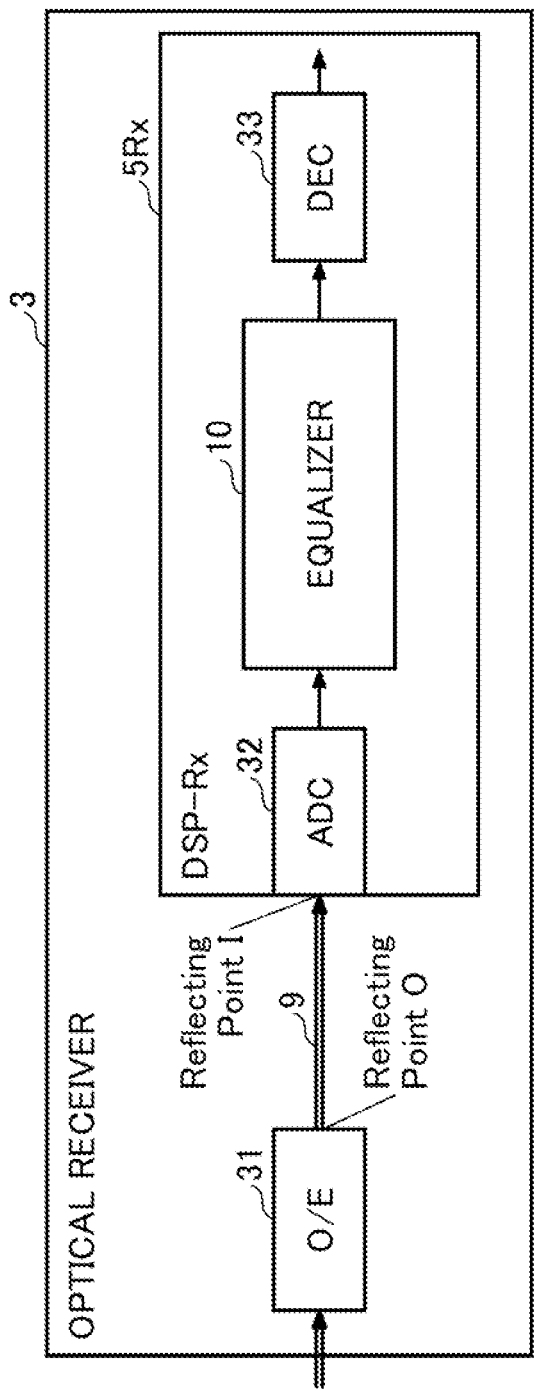
FIG. 6 is a schematic diagram of an optical receiver using an equalizer of the embodiment.

FIG. 6 is a schematic diagram of an optical receiver 3 using the equalizer 10 of the embodiment. The optical receiver 3 is also an example of the communication module 1. The optical receiver 3 has a DSP 5Rx and an optical to electrical circuit (denoted as "O/E" in the figure) 31. The optical to electrical circuit 31 is an optical receiver front-end circuit, which converts an optical signal received from an optical transmission line into an electrical signal. The optical to electrical circuit 31 has a photodiode, which serves as a photodetector, and a preamplifier including a transimpedance amplifier.

The optical to electrical circuit 31 and the DSP 5Rx are connected by an electric transmission line 9. The output end of the optical to electrical circuit 31 may become a reflecting point O. The input end to the DSP 5Rx may become a reflecting point I. The reflected wave generated on the transmission line 9 is mixed into the waveform of the received signal, appearing at a certain delay corresponding to the effective length of the transmission line, which causes waveform distortion and transmission loss.

The DSP 5Rx has an ADC 32, an equalizer 10, and a decoder (denoted as "DEC" in the figure) 33. The signal received from the optical network and converted into the electrical analog signal is then converted into a digital signal by the ADC 32. The equalizer 10 shapes the waveform of the digital signal and compensates for the reflection having occurred on the transmission 9. The waveform-shaped signal then undergoes a decoding process by the decoder 33.

The equalizer 10 can produce a delay of non-integer multiple of the fixed delay $\tau$ at a resolution of 1/M owing to the variable delay 121 or 122. Even when the transmission delay time D on the transmission line 9 is not an integer multiple of the fixed delay time, reflection can be accurately compensated for.

<Advantageous Effect of Equalizer>

FIG. 7A to FIG. 7C illustrate unit pulse signal waveforms with and without reflection. Calculations are performed based upon the round-trip transmission delay time D of 3.5 [UI]. FIG. 7A illustrates a signal waveform when there is no reflection occurring on the transmission line. FIG. 7B illustrates a signal waveform when reflection has occurred in a device without a reflection canceller. FIG. 7C illustrates a signal waveform when reflection has occurred, but cancelled or compensated for with the configuration of the embodiment.

For example, a pulse signal travels through the transmission line 57 between the DSP 5 and the connected part/assembly 56 (See FIG. 2). Without reflection on the transmission line 57, the shaped signal is a rectangular pulse signal rising at predetermined intervals, as illustrated in FIG. 7A.

When reflection exists on the transmission line 57, and when no reflection canceller is provided, reflected waves appear behind the rectangular pulses, delayed by the transmission delay time D as illustrated in FIG. 7B. The reflected waves cause transmission loss and deterioration of the eye pattern(s).

Using the equalizer 10 of the embodiment, the reflected waves that may appear after the transmission delay time D are cancelled, as illustrated in FIG. 7C, and a pulse waveform similar to that obtained when no reflection occurs can be achieved. The equalizer 10 compensates for reflection depending on the transmission delay time D, while expansion of the circuit scale of the bandwidth compensation FIR filter is minimized.

Figure 8A:
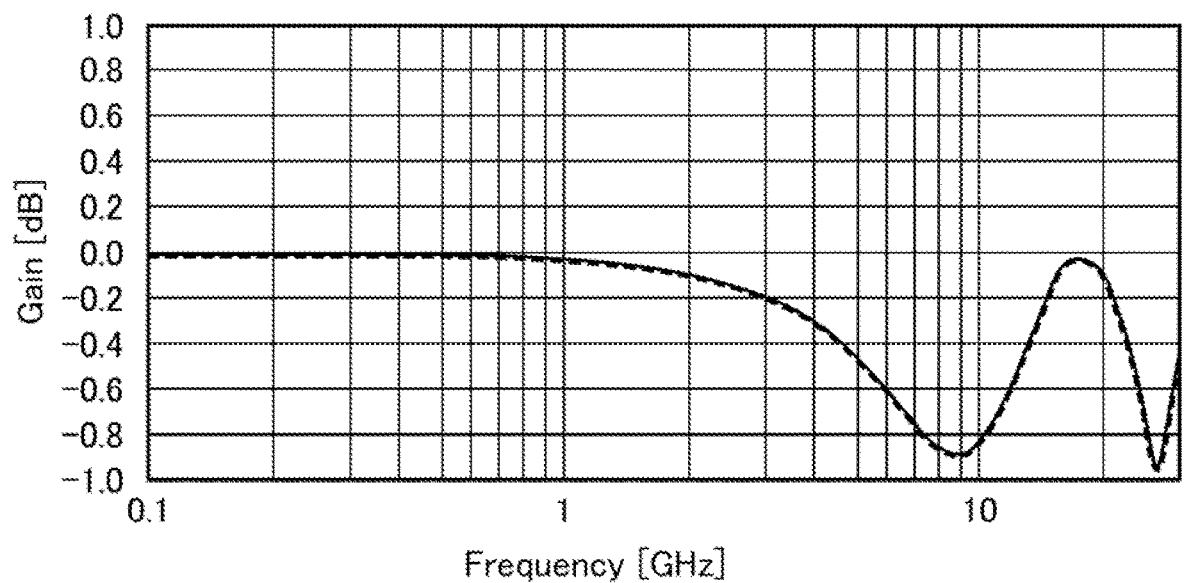
FIG. 8A illustrates compensation for a frequency characteristic according to an embodiment.
Figure 8B:
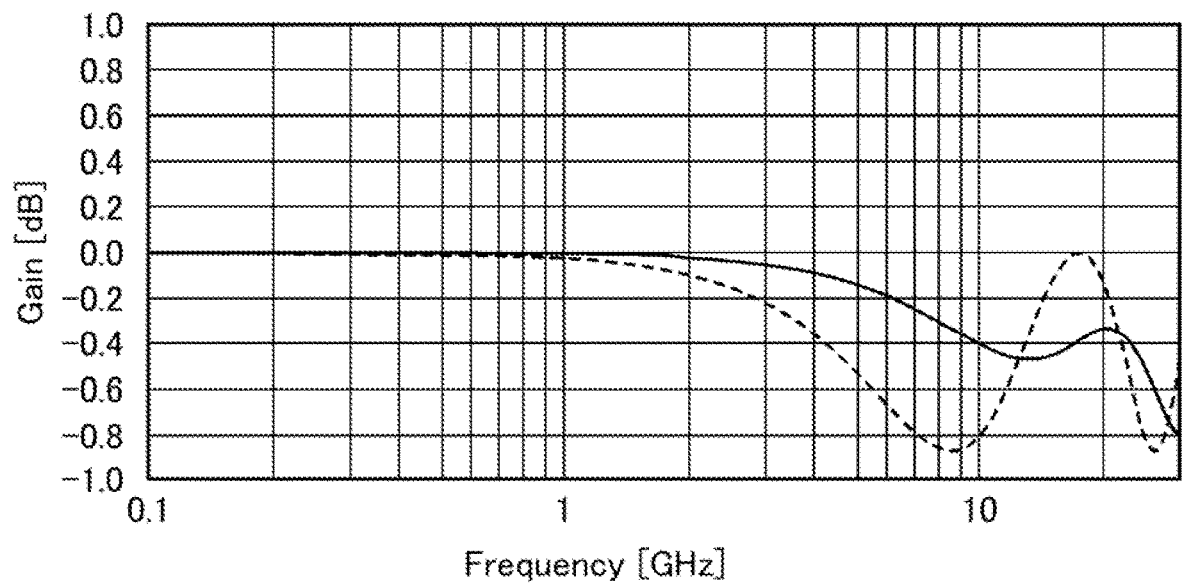
FIG. 8B illustrates compensation for frequency characteristic using a conventional device.
Figure 9A:
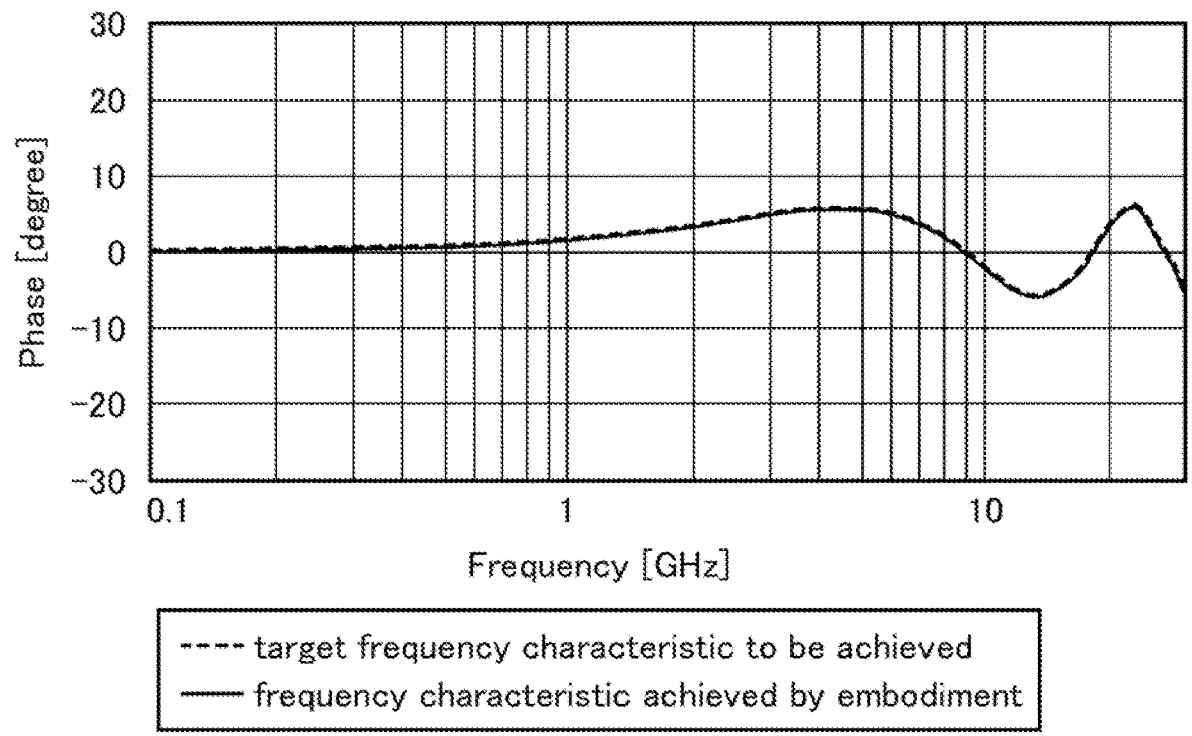
FIG. 9A illustrates compensation for another frequency characteristic according to an embodiment.
Figure 9B:
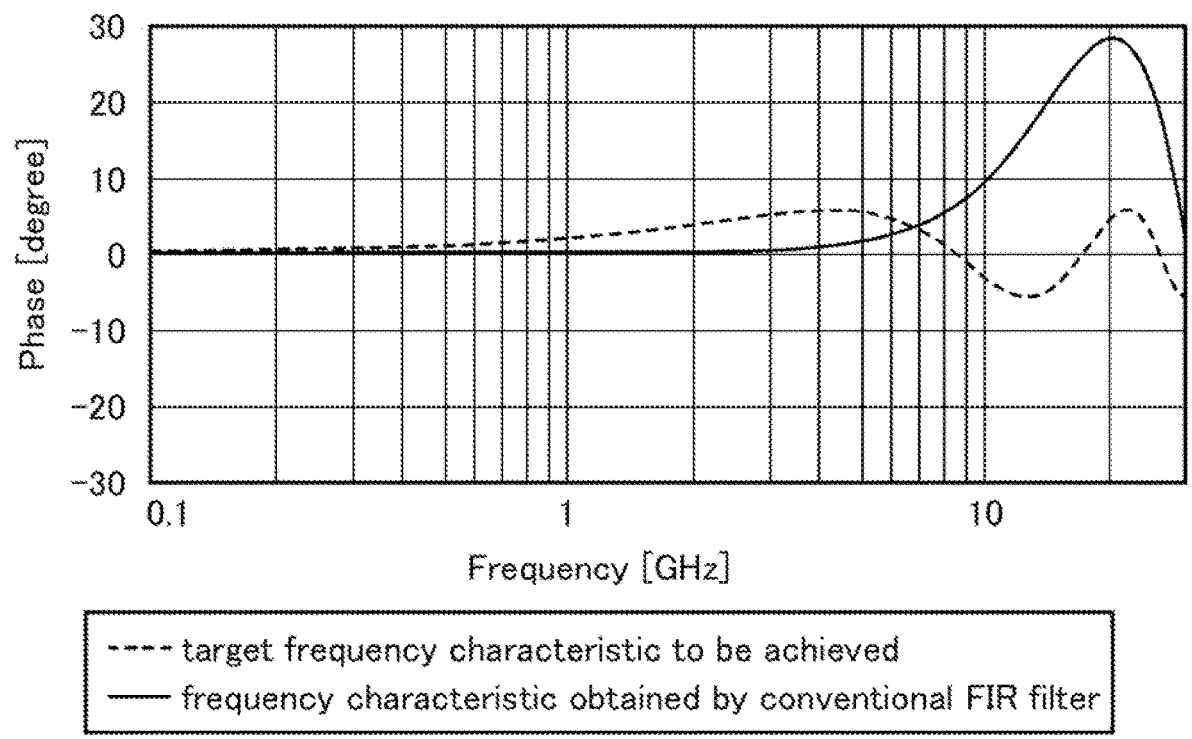
FIG. 9B illustrates compensation for another frequency characteristic using a conventional device.

FIG. 8A to FIG. 9B illustrate compensation for frequency characteristics. FIG. 8A and FIG. 9A are diagrams of a gain characteristic and a phase characteristic, respectively, acquired when the equalizer 10 of the embodiment is used. As a reference, FIG. 8B and FIG. 9B illustrate the gain characteristic and the phase characteristic, respectively, when a conventional FIR filter is used. The dashed lines in FIGS. 8A, 8B, 9A, and 9B represent target characteristics to be achieved under the conditions that the round-trip transmission delay time D between components is 3.5 [UI] at a symbol rate of 53 Giga baud, and that 10% reflection is generated.

The solid line in FIG. 8A represents the gain characteristic when reflection compensation is performed by the equalizer 10 of the embodiment, and the solid line in FIG. 9A represents the phase characteristic acquired when reflection compensation is performed by the equalizer 10. The solid lines in FIG. 8B and FIG. 9B represent a gain characteristic and a phase characteristic, respectively, acquired when reflection compensation is performed by a conventional FIR filter. In FIG. 8A to FIG. 9B, the number of taps of the filter is set to 5, and least square fitting is performed on the gain characteristic and the phase characteristic within the frequency band. During the least square fitting, weighting is appropriately applied between the gain characteristic and the phase characteristic, or depending on the frequency domain to be sampled.

In FIG. 8A and FIG. 9A, the target gain characteristic and phase characteristic are achieved by reducing or compensating for reflection using the equalizer 10 of the embodiment. In contrast, with the conventional FIR filter, the gain characteristic greatly deviates from the target characteristic, as illustrated in FIG. 8B. In order to achieve the target gain characteristic with the conventional FIR filter under the above-described conditions, the number of taps has to be significantly increased. Similarly, in FIG. 9B, the phase characteristic greatly deviates from the target characteristic.

With the equalizer 10 of the embodiment, reflection can be compensated for at a resolution 1/M (M>1) of the fixed delay τ, and the target gain characteristic and phase characteristic can be achieved without increasing the number of taps.

Figure 10A:
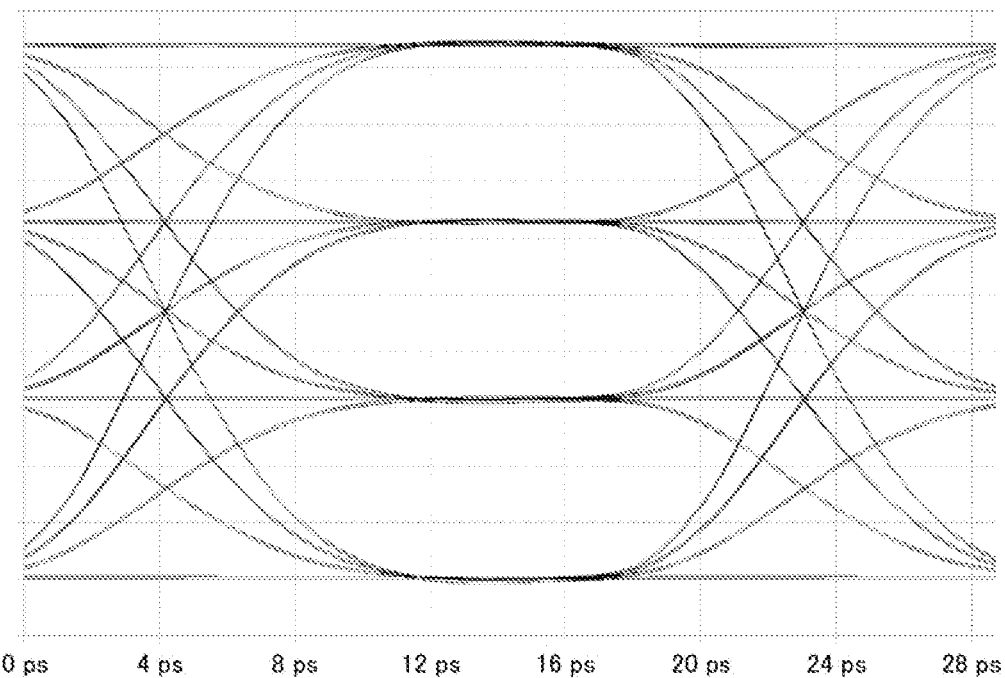
FIG. 10A is an eye diagram with reflection compensation according to an embodiment.
Figure 10B:
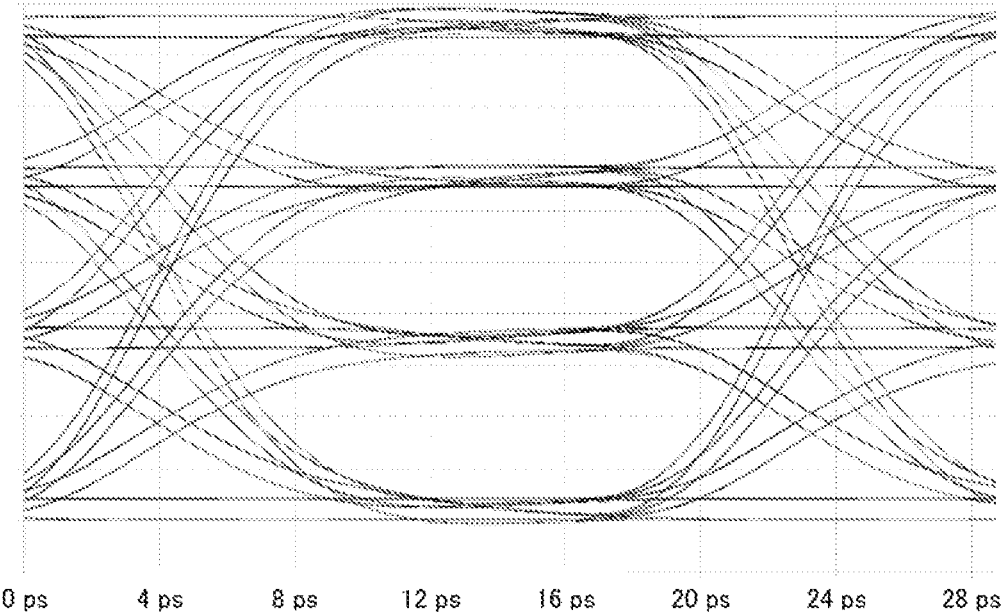
FIG. 10B is an eye diagram without reflection compensation.

FIG. 10A is an eye diagram acquired when reflection compensation according to the embodiment is performed. FIG. 10B is an eye diagram acquired without compensation for reflection, which is presented for the purpose of comparison with the embodiment. In FIG. 10A, by using the equalizer 10 of the embodiment, electric signals are converged to four voltage levels, and the respective eye openings are kept wide.

In contrast, in FIG. 10B where reflection is not compensated for, the amplitude varies at each voltage level. The eye openings become narrower, and the eye pattern is deteriorated. This is due to insufficient compensation for reflected waves generated on the transmission lines.

With the equalizer 10 of the embodiment, reflection can be compensated for at a resolution of 1/M (M>1) of the fixed delay t, and a satisfactory eye pattern can be maintained As has been described above, even when a delay of non-integer multiple of the fixed delay set in the equalizer 10 is generated, the reflection delay can be compensated for at a resolution of 1/M (M>1) of the fixed delay.

The equalizer according to the present disclosure is not limited to the specific configuration examples described above. The number of taps is not limited to five. The number of taps can be appropriately selected according to the degree of reflection compensation required in the optical transmitter or receiver, power consumption, circuit scale, or the like. The fixed delay set between taps is not limited to a 1-bit delay. In place of the configuration of summing up the total outputs from the respective taps, the outputs of the respective taps may be sequentially added. In this case, the output of the second multiplier 14 may be added to the sequentially added value of the first tapped delay line 11, or vice versa.

The equalizer of the embodiment achieves a frequency transmission characteristic in which the influence of a reflected wave is reduced or cancelled. Inter-symbol interference which occurs depending on the transmission characteristic is suppressed. When the equalizer 10 is applied to a transmitter, eye opening characteristics conforming to the Transmitter and Dispersion Eye Closure Quaternary (TDECQ) standard by the IEEE can be achieved. When the equalizer 10 is applied to a receiver, the receiver error-rate characteristics including the reception sensitivity, the maximum reception level, or the like can be optimized.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of superiority or inferiority of the invention. Although the embodiments of the present inventions have been described in detail, it should be understood that the various changes, substitutions, and alterations could be made hereto without departing from the spirit and scope of the invention.

What is claimed is:

1. An equalizer comprising:
   a first tapped delay line in which N taps are connected in cascade, where N is a positive integer;
   a second tapped delay line connected in parallel with the first tapped delay line, the second tapped delay line having one tap;
   a first multiplier configured to multiply signals extracted from the N taps by corresponding coefficients;
   a second multiplier configured to multiply a signal output from the second tapped delay line by a second coefficient; and
   an adder configured to add products of the first multiplier and a product of the second multiplier,
   wherein the first tapped delay line has a fixed delay, and the second tapped delay line has a variable delay changeable at a 1/M resolution of the fixed delay, where M is a number greater than 1, and
   wherein the variable delay is expressed as
   τ×(L+1/M)
   where τ is the fixed delay set between any two adjacent taps of the N taps, and L is an integer greater than or equal to zero.

2. The equalizer as claimed in claim 1, where the second multiplier is connected to an output of the variable delay.

3. The equalizer as claimed in claim 1, wherein the first multiplier includes N multipliers respectively connected to the N taps.

4. An equalizer comprising
   a first tapped delay line in which N taps are connected in cascade, where N is a positive integer;
   a second tapped delay line connected in parallel with the first tapped delay line, the second tapped delay line having one tap;
   a first multiplier configured to multiply signals extracted from the N taps by corresponding coefficients;
   a second multiplier configured to multiply a signal output from the second tapped delay line by a second coefficient;
   an adder configured to add products of the first multiplier and a product of the second multiplier; and
   N switches connected between the second tapped delay line and the N taps,
   wherein the first tapped delay line has a fixed delay, and the second tapped delay line has a variable delay changeable at a 1/M resolution of the fixed delay, where M is a number greater than 1, and
   wherein any one of the N switches is selectable.

5. The equalizer as claimed in claim 4, wherein the variable delay varies from τ/M to (N−1)×τ÷τ/M, depending on a switch selected, where τ is the fixed delay set between any two adjacent taps of the N taps.

6. A communication module comprising:
   a digital signal processor having an equalizer; and
   an assembly or a part connected to the digital signal processor,
   wherein the equalizer includes
      a first tapped delay line in which N taps are connected in cascade, where N is a positive integer,
      a second tapped delay line connected in parallel with the first tapped delay line, the second tapped delay line having one tap,
      a first multiplier configured to multiply signals extracted from the N taps by corresponding coefficients, a second multiplier configured to multiply a signal output from the second tapped delay line by a second coefficient, and an adder configured to add products of the first multiplier and a product of the second multiplier, wherein the first tapped delay line has a fixed delay, and the second tapped delay line has a variable delay changeable at a 1/M resolution of the fixed delay, where M is a number greater than 1, and wherein a value of the variable delay is determined in accordance with a reflection generated between the digital signal processor and the assembly or the part, wherein the assembly or the part is a modulator driver or an optical modulator, and wherein the value of the variable delay is determined according to a transmission delay time between the digital signal processor and the modulator driver, or a transmission delay time between the modulator driver and the optical modulator.

7. A communication comprising:

a digital signal processor having an equalizer; and an assembly or a part connected to the digital signal processor, wherein the equalizer includes a first tapped delay line in which N taps are connected in cascade, where N is a positive integer, a second tapped delay line connected in parallel with the first tapped delay line, the second tapped delay line having one tap, a first multiplier configured to multiply signals extracted from the N taps by corresponding coefficients, a second multiplier configured to multiply a signal output from the second tapped delay line by a second coefficient, and an adder configured to add products of the first multiplier and a product of the second multiplier, wherein the first tapped delay line has a fixed delay, and the second tapped delay line has a variable delay changeable at a 1/M resolution of the fixed delay, where M is a number greater than 1, wherein a value of the variable delay is determined in accordance with a reflection generated between the digital signal processor and the assembly or the part, wherein the assembly or the part is an optical-to-electrical circuit, and wherein the value of the variable delay is determined according to a transmission delay time between the digital signal processor and the optical-to-electrical circuit.

* * * * *